United States Patent
Sheng et al.

(10) Patent No.: US 7,349,210 B2
(45) Date of Patent: Mar. 25, 2008

(54) GREASE COVER FOR HEAT DISSIPATING APPARATUS

(75) Inventors: Jian-Qing Sheng, Guangdong (CN); Chin-Lung Chen, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 307 days.

(21) Appl. No.: 11/164,328

(22) Filed: Nov. 18, 2005

(65) Prior Publication Data

US 2006/0268513 A1    Nov. 30, 2006

(30) Foreign Application Priority Data

May 29, 2005   (CN) .................. 2005 2 0059315 U

(51) Int. Cl.
*H05K 7/20* (2006.01)

(52) U.S. Cl. .................. 361/695; 361/707; 361/710; 257/719; 257/726; 174/16.3; 165/185; 165/80.3; 165/905; 439/76.1

(58) Field of Classification Search ............... 361/695, 361/707, 710; 174/16.3; 257/719, 726; 439/76.1; 165/80.3, 185, 905
See application file for complete search history.

(56) References Cited

U.S. PATENT DOCUMENTS

| | | | |
|---|---|---|---|
| 5,402,313 A * | 3/1995 | Casperson et al. .......... | 361/710 |
| 5,812,375 A * | 9/1998 | Casperson .................. | 361/707 |
| 5,897,917 A | 4/1999 | Hinshaw et al. | |
| 5,931,222 A * | 8/1999 | Toy et al. .................. | 165/80.3 |
| 5,969,949 A * | 10/1999 | Kim et al. ................... | 361/704 |
| 6,029,740 A * | 2/2000 | Lee et al. ..................... | 165/76 |
| 6,049,458 A | 4/2000 | Lee et al. | |
| 6,055,158 A * | 4/2000 | Pavlovic ..................... | 361/704 |
| 6,111,760 A * | 8/2000 | Nixon ........................ | 361/814 |
| 6,230,789 B1 * | 5/2001 | Pei et al. .................... | 165/80.3 |
| 6,243,265 B1 * | 6/2001 | Wong et al. ................ | 361/704 |
| 6,396,696 B1 * | 5/2002 | Lin et al. .................... | 361/704 |
| 6,785,137 B2 * | 8/2004 | Siegel ......................... | 361/704 |
| 6,791,847 B2 * | 9/2004 | Ma ............................. | 361/816 |
| 6,881,077 B2 * | 4/2005 | Throum ..................... | 439/76.1 |
| 6,926,540 B1 * | 8/2005 | Juntwait .................... | 439/76.1 |
| 6,952,348 B2 * | 10/2005 | Wu ............................ | 361/719 |
| 7,051,790 B2 * | 5/2006 | Lin ............................ | 165/80.2 |
| 7,063,136 B2 * | 6/2006 | Yu et al. ..................... | 165/185 |
| 7,068,514 B2 * | 6/2006 | Chang et al. ............... | 361/705 |
| 7,123,483 B2 * | 10/2006 | Otsuki et al. ............... | 361/710 |
| 7,221,567 B2 * | 5/2007 | Otsuki et al. ............... | 361/695 |

(Continued)

*Primary Examiner*—Boris Chervinsky
*Assistant Examiner*—Courtney L Smith
(74) *Attorney, Agent, or Firm*—Winston Hsu

(57) ABSTRACT

A grease cover (50) for protecting grease spread on a bottom surface of a heat sink (20) includes a base wall (51), a plurality of sidewalls (52a, 52b, 52c, 52d), a protecting space (53) between the base wall and the sidewalls, a holding space in an upper portion of the protecting space, and two projections (54). The protecting space is for accommodating the grease. The holding space is for receiving the heat sink therein. The projections extend from two opposite sidewalls of the grease cover. A top surface of each of the projections spaces a distance from the base wall, for supporting the bottom surface of the heat sink to enable the grease away from the base wall, when the heat sink is received in the holding space.

18 Claims, 7 Drawing Sheets

U.S. PATENT DOCUMENTS

| | | | |
|---|---|---|---|
| 7,280,362 B2 * | 10/2007 | Hood et al. | 361/719 |
| 2002/0067596 A1 * | 6/2002 | Searls et al. | 361/695 |
| 2004/0252461 A1 * | 12/2004 | Wu | 361/704 |
| 2005/0181642 A1 * | 8/2005 | Juntwait | 439/76.1 |
| 2005/0225939 A1 * | 10/2005 | Otsuki et al. | 361/695 |
| 2006/0042787 A1 * | 3/2006 | Yu et al. | 165/185 |

* cited by examiner

GREASE COVER FOR HEAT DISSIPATING APPARATUS

FIELD OF THE INVENTION

The present invention relates generally to a grease cover, and particularly to a grease cover for a heat dissipating apparatus to separate thermal grease spread on the heat dissipating apparatus from surrounding articles.

DESCRIPTION OF RELATED ART

A layer of thermal grease is usually spread on a bottom surface of a heat sink to improve heat conductivity between the heat sink and an electronic heat-generating component. The heat generated by the electronic component causes the thermal grease to become more liquid, enabling the thermal grease to fill in air gaps formed between the heat sink and the electronic component, thereby improving heat conductivity between the heat sink and the electronic component.

Since the thermal grease is not solid at ambient temperature, it may contaminate surrounding articles or be contaminated by dust or foreign particles before the heat sink is assembled to the electronic component. To avoid the contamination, a grease cover is needed to separate the thermal grease from the surrounding articles.

Conventionally, a grease cover used for separating the thermal grease from the surrounding articles includes a base wall, a protecting space formed at a middle portion of the base wall for separating the thermal grease from the surrounding articles, and two wings horizontally extending from two opposite sides of the base wall. In order to attach the cover onto the heat sink, a layer of adhesive is affixed to each of the wings of the cover. The adhesive connects the grease cover to the bottom surface of the heat sink. To separate the grease cover from the heat sink, a user needs to exert a large pulling force on the grease cover to overcome the connection made by the adhesive. Furthermore, the adhesive still sticks to the bottom surface of the heat sink after the cover is taken off from the heat sink. The remained adhesive on the heat sink deteriorates the appearance of the heat sink and sometimes may contaminate electronic components when the user is not careful in handling the heat sink. Accordingly, a grease cover which does not use adhesive and can be conveniently taken off from the heat sink is needed.

SUMMARY OF INVENTION

The present invention relates to a grease protecting apparatus. According to a preferred embodiment of the present invention, a grease cover adapted for protecting thermal grease spread on a bottom surface of a heat sink includes a base wall, a plurality of sidewalls, a protecting space, a holding space, and two projections. The sidewalls are disposed around the base wall, and defining the protecting space with the base wall. The protecting space is adapted for accommodating the thermal grease. The holding space is defined at a top portion of the protecting space, adapted for engagingly receiving the heat sink therein. The projections extend from two opposite ones of the sidewalls of the grease cover toward a center thereof. A top surface of each of the projections spaces a distance from the base wall, adapted for supporting the bottom surface of the heat sink to enable the grease away from the base wall when the heat sink is received in the holding space.

Other advantages and novel features of the present invention will become more apparent from the following detailed description of preferred embodiment when taken in conjunction with the accompanying drawings, in which:

DETAILED DESCRIPTION

Figure 1:
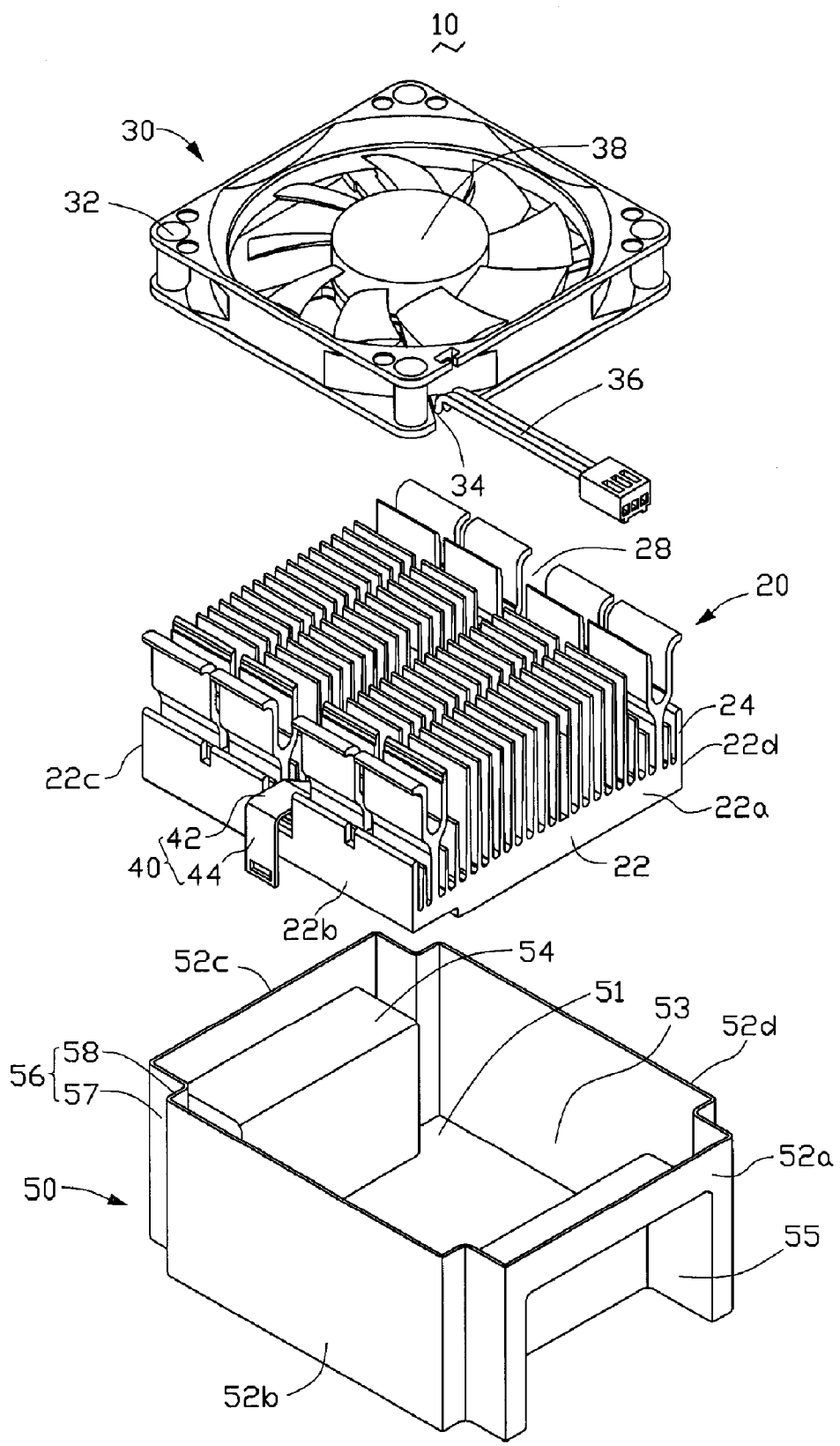
FIG. 1 is an exploded, isometric view of a heat dissipating apparatus according to a preferred embodiment of the present invention.
Figure 2:
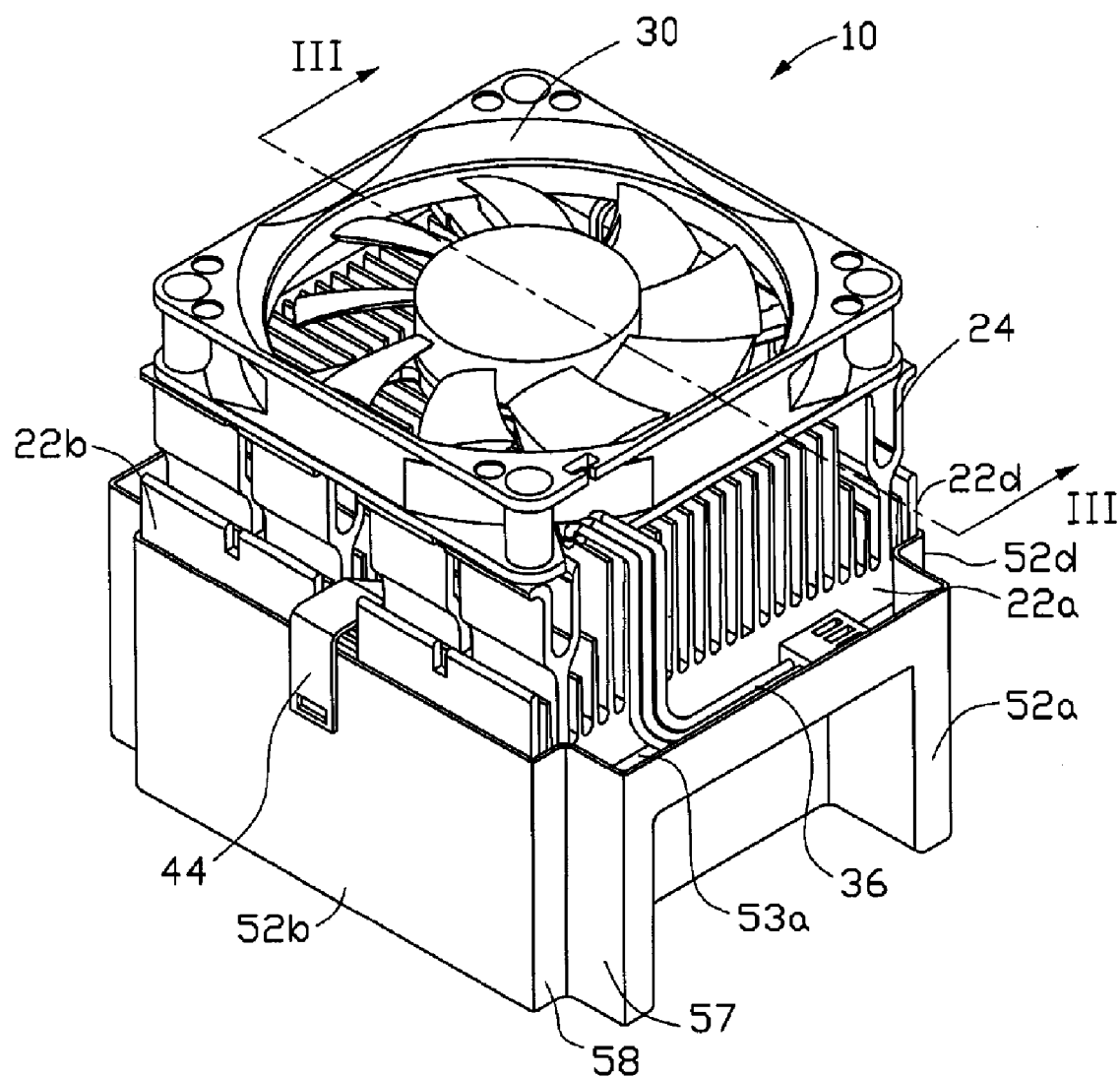
FIG. 2 is an assembled view of the heat dissipating apparatus of FIG. 1.
Figure 3:
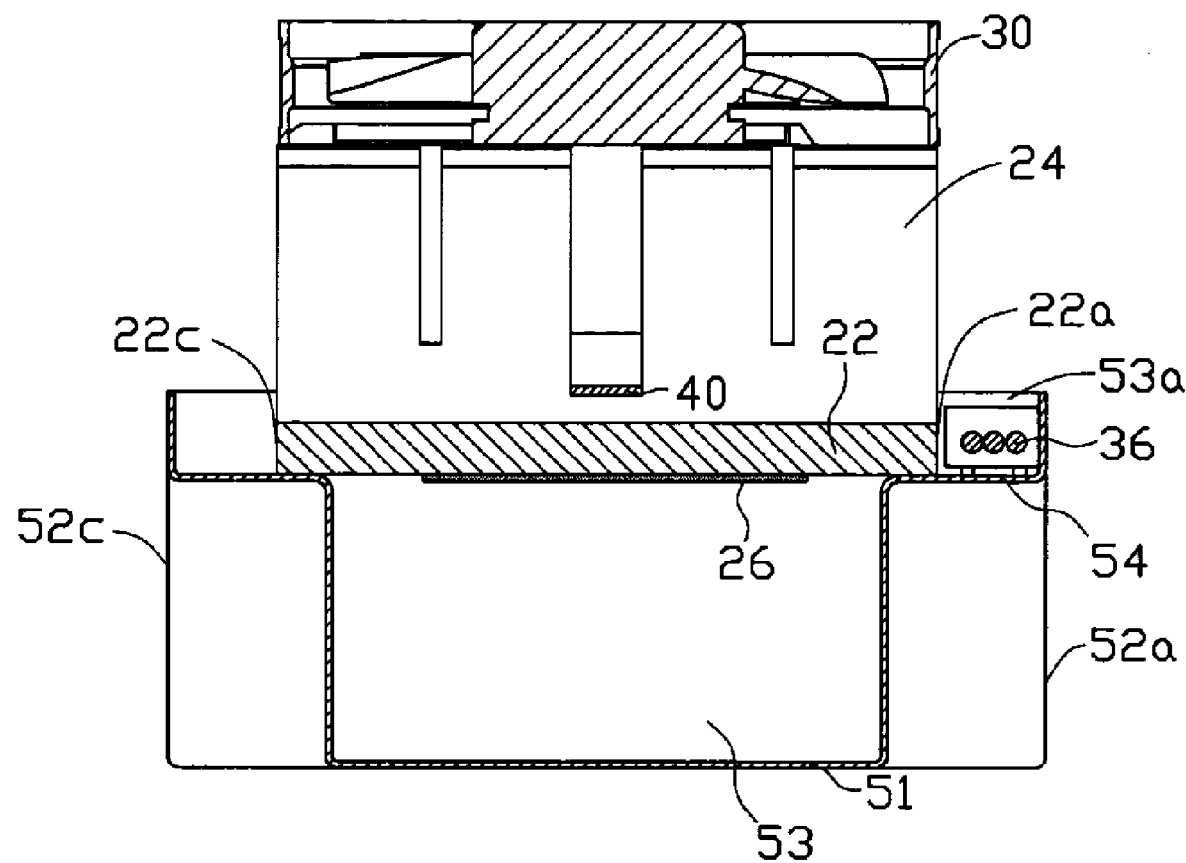
FIG. 3 is a cross-sectional view taken along line III-III of FIG. 2.
Figure 4:
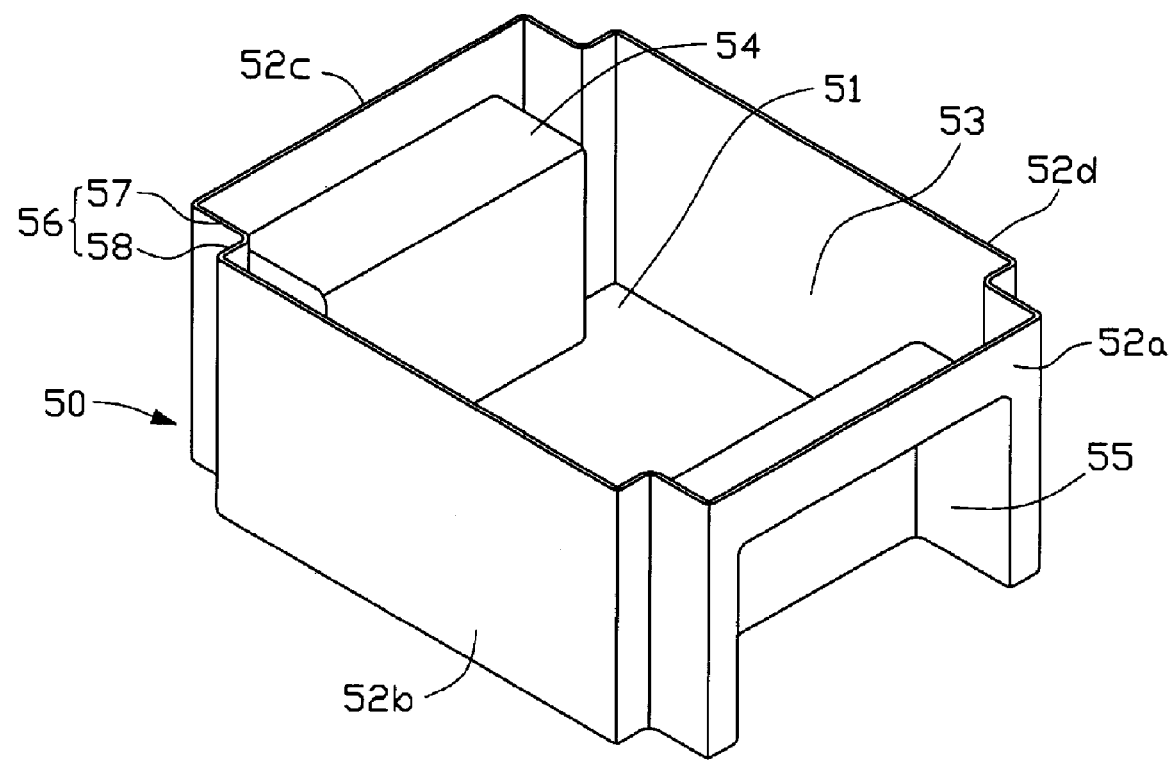
FIG. 4 is an isometric view of a grease cover of the heat dissipating apparatus of FIG. 1.
Figure 5:
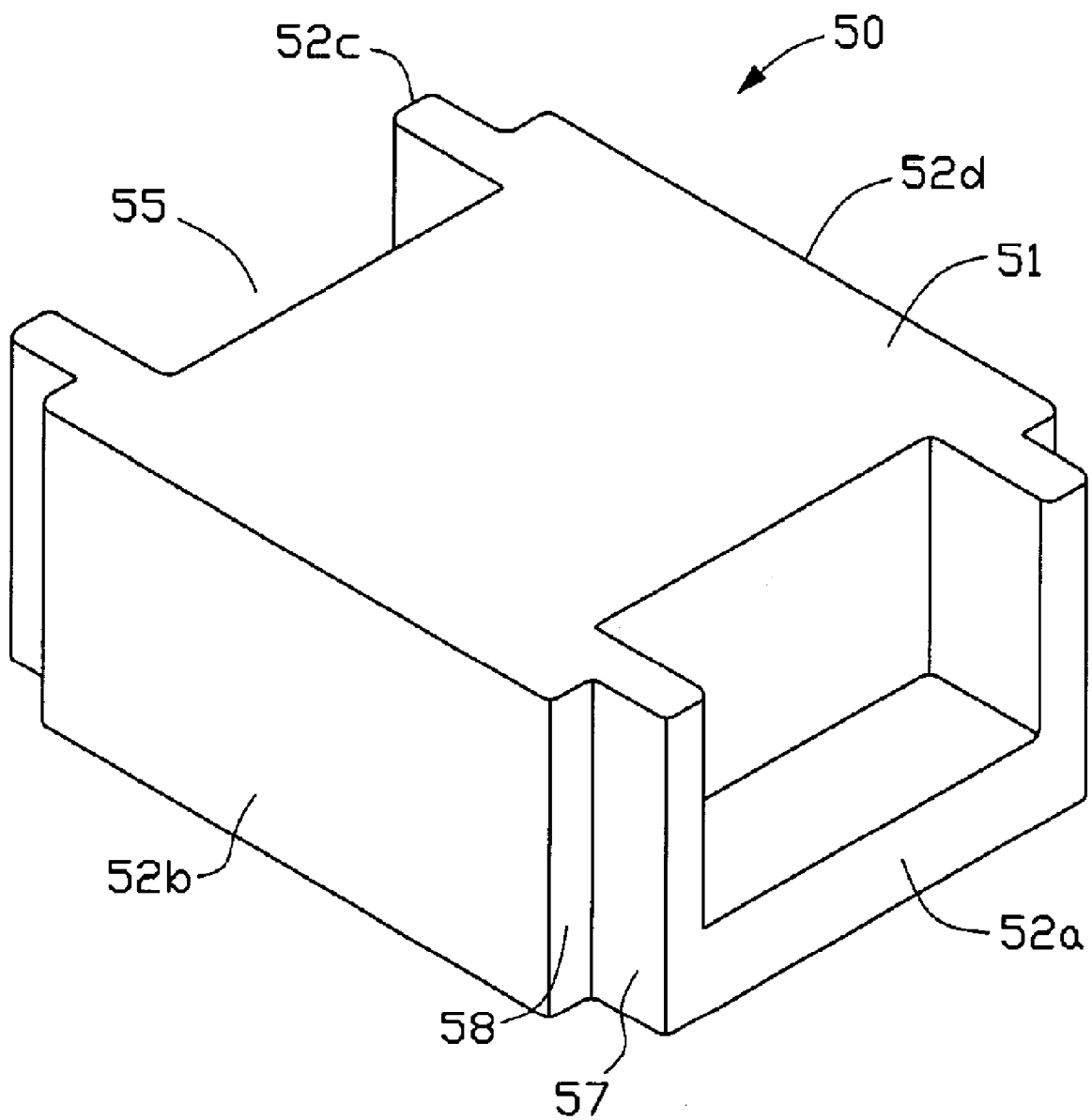
FIG. 5 is an isometric view of the grease cover of the heat dissipating apparatus of FIG. 1, viewed from a different aspect.

Referring to FIGS. 1 to 3, a heat dissipating apparatus 10 according to a preferred embodiment of the present invention includes a heat sink 20, a fan 30, clip 40, and a grease cover 50.

The heat sink 20 includes a base 22, and a plurality of fins 24 extending upwardly from the base 22. The base 22 is substantially square shaped. A layer of thermal grease 26 (shown in FIG. 3) is spread on a middle portion of a bottom surface of the base 22, for improving heat conductivity between the heat sink 20 and an electronic heat-generating component (not shown) to which the heat sink 20 is to be mounted for absorbing heat therefrom. The fins 24 are perpendicularly extended from the base 22. A channel 28 is defined at a middle portion of the heat sink 20 crossing through the fins 24.

The fan 30 is mounted on a top portion of the heat sink 20. Four through holes 32 are defined at four corners of the fan 30, for mounting the fan 30 onto the heat sink 20 via four screws (not shown) extending therein. A cutout 34 is defined adjacent to one corner of the fan 30. A group of wires 36 connected with a motor 38 of the fan 30 extends through the cutout 34 to connect with a power supply (not shown) for driving the fan 30 to rotate.

The clip 40 is made of a metal plate, and includes an elongate main body 42 and two clasping portions 44 (only one shown) at two ends of the main body 42, respectively. The main body 42 is received in the channel 28 of the heat sink 20. The clasping portions 44 are bent downwardly at the two ends of the main body 42 for mounting the heat sink 20 onto the heat-generating component.

The grease cover 50 is disposed at a bottom surface of the heat sink 20, for enclosing the thermal grease 26, thereby preventing the thermal grease 26 from contaminating surrounding articles or being contaminated by dust or foreign articles. The grease cover 50 is made of plastics materials, and includes a rectangular base wall 51, four sidewalls 52a, 52b, 52c, 52d extending upwardly from four sides of the base wall 51, respectively, and a grease protecting space 53 enclosed by the sidewalls 52a, 52b, 52c, 52d and the base wall 51. The grease cover 50 defines two indentations 55 in the two opposite sidewalls 52a, 52c thereof, thereby forming a pair of projections 54 toward a central portion of the grease protecting space 53 from the two opposite sidewalls 52a, 52c, respectively. The projections 54 are integral with the base wall 51. A top surface of each of the projections 54 spaces a distance from the base wall 51. Four abutting portions 56 are disposed at four corners of the grease cover 50. Each of the abutting portions 56 includes a first plate 57 perpendicularly extending inwardly from the sidewall 52a/52c, and a second plate 58 perpendicularly extending inwardly from the sidewall 52b/52d. The first plate 57 is perpendicular to the second plate 58 as viewed from a top of the grease cover 50. A cutout (not labeled) is defined in each of the corners of the grease cover 50 by the abutting portion 56. A width of the first plate 57 is smaller than a width of a corresponding projection 54 (i.e., a depth of the indentation 55 from a corresponding side wall 52a/52c) as viewed from the sidewall 52b/52d. This design enables the projection 54 to extend inwardly beyond a corresponding second plate 58.

In assembly of the heat dissipating apparatus, the main body 42 of the clip 40 is received in the channel 28 of the heat sink 20, with the two clasping portions 44 extending beyond two opposite sides 22b, 22d of the base 22 of the heat sink 20. The fan 30 is mounted to the top portion of the heat sink 20 via the screws, to preassemble the heat sink 20, the clip 40, and the fan 30 together. The wires 36 of the fan 30 are positioned adjacent to a side 22a of the base 22 of the heat sink 20. Then, the preassembled heat sink 20, clip 40 and fan 30 are put into a top portion of the protecting space 53 of the grease cover 50. Meanwhile, the bottom surface of the heat sink 20 abuts against the top surfaces of the projections 54. Two opposite sides 22a, 22c of the base 22 of the heat sink 20 abut against the second plates 58 of the abutting portions 56 of the grease cover 50, and the other two opposite sides 22b, 22d of the base 22 of the heat sink 20 abut against the sidewalls 52b, 52d of the grease cover 50. Thus, the preassembly of the heat sink 20, clip 40 and fan 30 is mounted to the grease cover 50, with the thermal grease 26 being accommodated in the grease protecting space 53. In this position, the two clasping portions 44 of the clip 40 are located outside the sidewalls 52b, 52d of the grease cover 50, respectively. A receiving cavity 53a is formed between the side 22a of the base 22 of the heat sink 20 and the sidewall 52a of the grease cover 50. Finally, the wires 36 of the fan 30 are placed in the receiving cavity 53a of the grease cover 50. Thus, the heat dissipating apparatus 10 is assembled completely.

In the present invention, the thermal grease 26 spread on the bottom surface of the base 22 of heat sink 20 is accommodated by the grease protecting space 53 of the grease cover 50, thereby preventing the thermal grease 26 from contaminating surrounding articles or being contaminated by dust or foreign articles. The grease cover 50 is mounted to the heat sink 20 via friction forces produced between the four sides 22a, 22b, 22c, 22d of the base 22 of the heat sink 20 and the sidewalls 52b, 52d and second plates 58 of the abutting portions 56 of the grease cover 50. The friction forces enable the grease cover 50 to be secured to the heat sink 20 when there is no pulling force acting on the grease cover 50 relative to the heat sink 20. Nevertheless, the grease cover 50 can be easily separated from the heat sink 20 by applying a pulling force to the grease cover 50.

Figure 6:
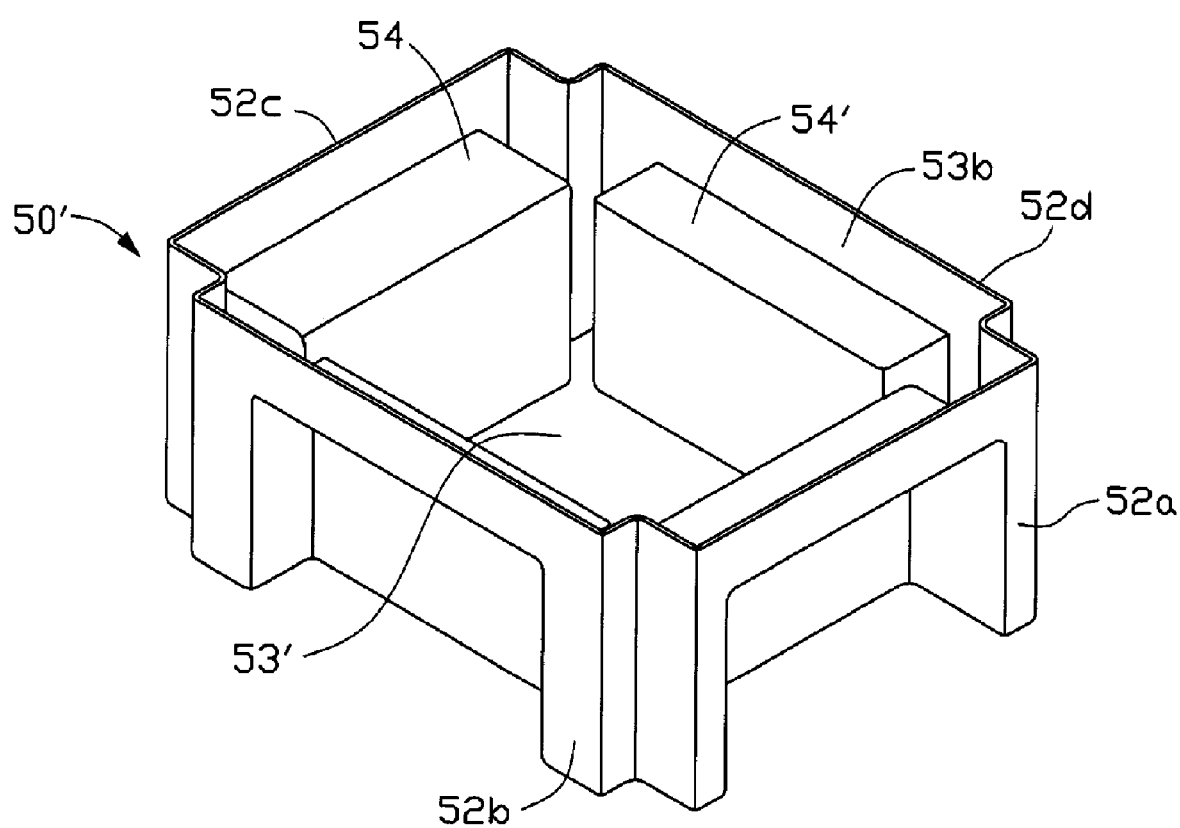
FIG. 6 is an isometric view of the grease cover of the heat dissipating apparatus according to a second embodiment of the present invention.

Referring to FIG. 6, a grease cover 50' according to a second embodiment of the present invention is shown. In this modified embodiment, each of the other two sidewalls 52b, 52d of the grease cover 50' also extends a projection 54' toward the central portion of protecting space 53'of the grease cover 50'. When the heat sink 20 is mounted to the grease cover 50' the heat sink 20 is supported by top surfaces of the projections 54', in addition to the top surfaces of the projections 54 of the grease cover 50'. Therefore, the heat sink 20 can be more stably mounted in the grease cover 50'.

Figure 7:
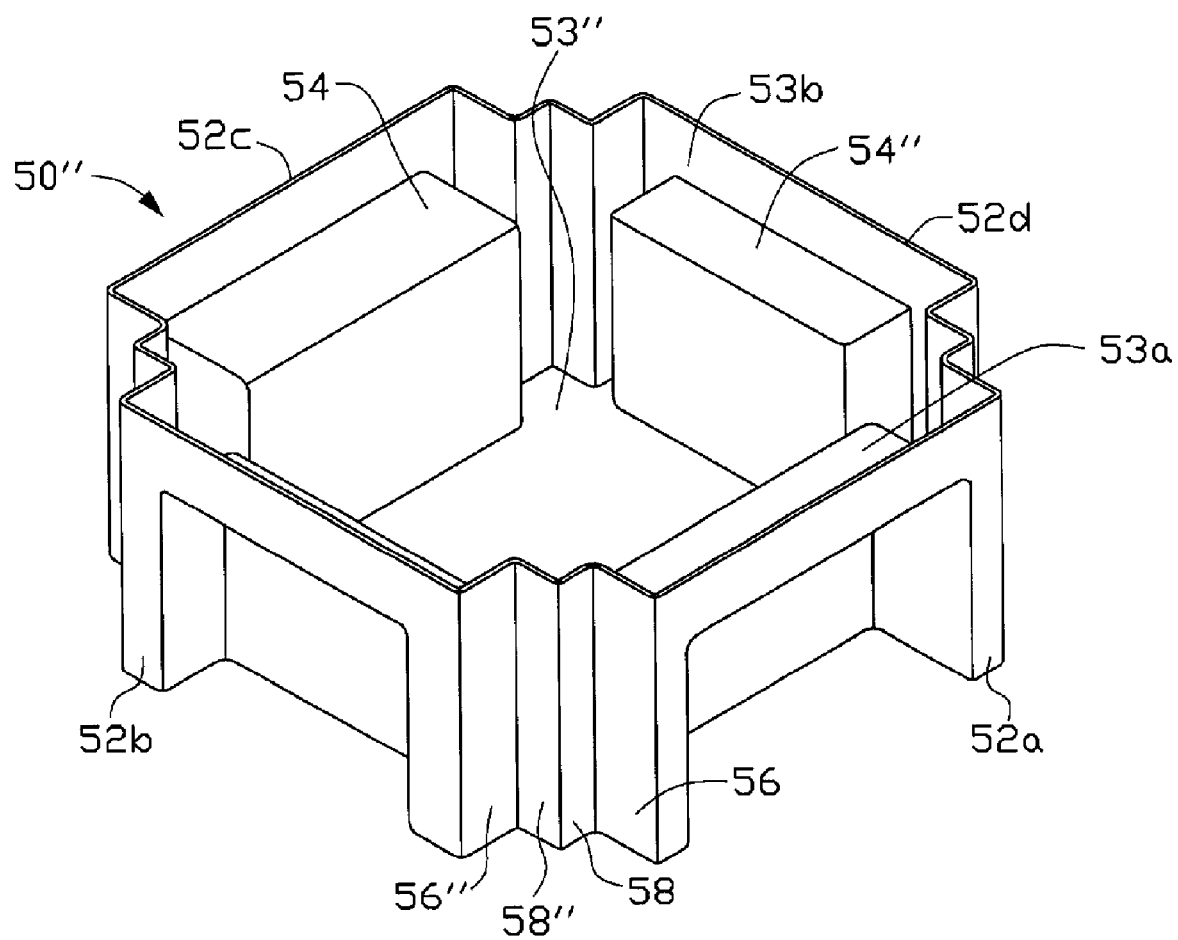
FIG. 7 is an isometric view of the grease cover of the heat dissipating apparatus according to a third embodiment of the present invention.

Referring to FIG. 7, a grease cover 50" according to a third embodiment of the present invention is shown. The difference between this embodiment and the second embodiment is in that the grease cover 50" further includes another abutting portion 56" at each of four corners thereof. The abutting portions 56" connect the four abutting portions 56 to the sidewalls 52b, 52d. According to this embodiment, the heat sink 20 is put into the top portion of the grease protecting space 53" of the grease cover 50", with the bottom surface of the base 22 of the heat sink 20 abutting against the top surfaces of the projections 54, 54" of the grease cover 50", and the second plates 58, 58" of the abutting portions 56, 56" of the grease cover 50" abutting against the four sides 22a, 22b, 22c, 22d of the base 22 of the heat sink 20 around four corners of the base 22 of the heat sink 20. After the heat dissipating apparatus is assembled, two receiving spaces 53b for receiving the clasping portions 44 of the clip 40 will be formed between the two sides 22b, 22d of the base 22 of the heat sink 20 and the sidewalls 52b, 52d of the grease cover 50". The grease cover 50" defines the receiving cavity 53a between the side 22a of the base 22 of the heat sink 20 and the side wall 52a of the grease cover 50" for receiving the wires 36 of the fan 30. This design enables the heat sink 20, the clip 40, the fan 30, and the grease cover 50" to be more compactly assembled together, which benefits the transportation of the heat dissipating apparatus.

In a further alternative embodiment, although it is not shown in the drawings, it can be easily obtained by those skilled in the art by modifying the first embodiment by canceling the two abutting portions 56 adjacent to the sidewall 52c of the grease cover 50, thereby making the side 22c of the heat sink 20 directly abut against the sidewall 52c of the grease cover 50. Furthermore, the projections 54 may extend from the two opposite sidewalls 52a, 52c, and space a distance with the base wall 51 of the grease cover 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A grease cover adapted for protecting grease spread on a bottom surface of a heat sink, the grease cover comprising:
   a base wall;
   a plurality of sidewalls disposed around the base wall;
   a protecting space defined between the base wall and the sidewalls, adapted for accommodating the grease;
   a holding space defined at a top portion of the protecting space, adapted for engagingly receiving the heat sink therein; and
   at least a pair of projections extending from at least a pair of opposite sidewalls thereof at least a pair of indentations being defined in the at least a pair of opposite sidewalls and corresponding to the at least a pair of projections, respectively, a top surface of each of the projections spacing a distance from the base wall, adapted for supporting the bottom surface of the heat sink to enable the grease away from the base wall when the heat sink is received in the holding space wherein a receiving cavity is defined between a bottom wall of the heat sink and each of the two opposite sidewalls of the grease cover when the heat sink is received in the holding space; and a fan comprising a plurality of wires, the wires being received in the receiving cavity.

2. The grease cover as described in claim 1, further comprises at least a pair of abutting portions adjacent to one of the projections, the holding space is enclosed by the sidewalls of the grease cover and the abutting portions.

3. The grease cover as described in claim 1, further comprises four pairs of abutting portions at corners thereof, the holding space is enclosed by the abutting portions.

4. The grease cover as described in claim 1, wherein the projections are integrally formed with the base wall.

5. The grease cover as described in claim 1, wherein the projections are spaced from the base wall.

6. A heat dissipating apparatus comprising:
a heat sink comprising a bottom surface spread with thermal grease thereon; and
a grease cover for enclosing the grease therein, the grease cover comprising:
a base wall;
a plurality of sidewalls disposed around the base wall and defining together with the base wall, a protecting space therein for accommodating the grease; and
a plurality of abutting portions disposed at corners thereof for abutting against sides of the heat sink; and
at least a projection adjacent to one of the sidewalls of the grease cover and, abutting against the bottom surface of the heat sink, for supporting the grease away from the base wall a receiving cavity defined between a bottom portion of the heat sink and the one of the sidewalls of the grease cover; and a fan comprising a plurality of wires, the wires being received in the receiving cavity and rested on the projection.

7. The heat dissipating apparatus as described in claim 6, wherein the abutting portion comprises a first plate and a second plate perpendicularly extending from the first plate, the second plate abuts against a corresponding side of the heat sink.

8. The heat dissipating apparatus as described in claim 7, wherein the at least a projection extends into the grease cover a distance beyond the second plate.

9. The heat dissipating apparatus as described in claim 6, further comprises a clip for mounting the heat sink onto a heat-generating component, the clip comprises a main body received in the heat sink, and two clasping portions extending beyond two opposite sides of the heat sink.

10. The heat dissipating apparatus as described in claim 9, wherein the grease cover defines two receiving spaces therein for receiving the clasping portions of the clip.

11. The heat dissipating apparatus as described in claim 6, wherein the projection is integrally formed with the base wall.

12. The heat dissipating apparatus as described in claim 6, wherein the projection is spaced from the base wall.

13. A heat dissipation device comprising:
a grease cover having a bottom wall, four sidewalls extending upwardly from the bottom wall, the bottom wall and the sidewalls cooperatively defining a grease protecting space therebetween, and first and second of projections located in the grease protecting space and adjacent to two opposite first and second sidewalls of the grease cover;
a heat sink having a bottom wall with a bottom surface spread with thermal grease, the bottom wall being seated on top faces of the projections and the thermal grease being received in the grease protecting space between the first and second projections, a cavity being defined between the bottom wall of the heat sink and the first sidewall of the grease cover and a fan mounted on the heat sink, the fan having power wires received in the cavity and rested on the first projection which is located adjacent to the first sidewall of the grease cover.

14. The heat dissipation device as described in claim 13, wherein the grease cover has four abutting portions at four corners thereof, respectively, each abutting portion forms a cutout in a corresponding corner, the bottom wall of the heat sink engages the four abutting portions.

15. The heat dissipation device as described in claim 13, wherein the grease cover includes a second pair of projections in the grease protecting space and located adjacent to the other two opposite ones of the sidewalls, the heat sink being also seated on top faces of the second pair of projections.

16. The heat dissipation device as described in claim 13, wherein the grease cover includes two abutting portions at two of four corners thereof, respectively, the two abutting portions defines two cutouts in the two corners, respectively, the bottom wall of the heat sink engaging the two abutting portions.

17. The heat dissipation device as described in claim 13, wherein the projections are spaced from the bottom wall of the grease cover.

18. The heat dissipation device as described in claim 13, wherein a pair of abutting portions is formed at each of four corners of the grease cover, each abutting portion includes perpendicularly connected first and second plates, and the second plates of the pair of abutting portions are perpendicularly connected together, each of the four corners of the bottom wall of the heat sink engages with the connected second plates of the pair of the abutting portions.

* * * * *